United States Patent [19]

Hesler et al.

[11] 4,002,999
[45] Jan. 11, 1977

[54] STATIC INVERTER WITH CONTROLLED CORE SATURATION

[75] Inventors: Joseph P. Hesler, Liverpool; Samuel M. Korzekwa, Baldwinsville, both of N.Y.

[73] Assignee: General Electric Company, Syracuse, N.Y.

[22] Filed: Nov. 3, 1975

[21] Appl. No.: 628,564

[52] U.S. Cl. .............................. 331/113 A; 321/2; 321/12
[51] Int. Cl.² ........................................ H03K 3/281
[58] Field of Search ...................... 321/2, 12, 45 R; 331/62, 113 A; 340/174 CT

[56] References Cited
UNITED STATES PATENTS

| | | | |
|---|---|---|---|
| 3,541,428 | 11/1970 | Schwartz | 323/56 |
| 3,611,330 | 10/1971 | Cacossa | 321/11 |
| 3,914,680 | 10/1975 | Hesler et al. | 331/113 A |

OTHER PUBLICATIONS

(S01070020) IEEE Transactions on Magnetics, vol. Mag-5, No. 4, pp. 908–912, Dec. 1969.

Primary Examiner—William H. Beha, Jr.
Attorney, Agent, or Firm—Richard V. Lang; Carl W. Baker; Frank L. Neuhauser

[57] ABSTRACT

A static inverter is disclosed for d.c. to a.c. conversion comprising a pair of switching semiconductor devices and a power transformer having primary, secondary and control windings associated with a double apertured linear magnetic core. Each aperture partitions the core cross section in a localized region into two branches. The primary and secondary power windings encircle the full core, which has a closed magnetic path, while the control windings are associated with only a branch. Means are provided to cause one branch to saturate before the other branch and before full core saturation. Saturation of one branch is used to reduce the regenerative feedback and increase the degenerative feedback to provide an advance turn off, allowing charge stored in the switching device to dissipate prior to the end of each conduction period. This mode of the feedback control avoids full core saturation and avoids overstressing the switching devices that full core saturation would produce. The arrangement permits one to develop high power outputs from relatively inexpensive power transistors.

10 Claims, 8 Drawing Figures

STATIC INVERTER WITH CONTROLLED CORE SATURATION

BACKGROUND OF THE INVENTION

1. Field of the Invention

The present invention relates to static inverters by which electrical energy in the d.c. form is converted to electrical energy in the a.c. form through non-moving or static means. The present invention falls into the class of inverters in which a d.c. source is used to produce current through a pair of alternately switched semiconductor devices connected in series with the primary windings of a power transformer and producing an a.c. output in the transformer secondary.

2. Description of the Prior Art

Static inverters of the class empolying a d.c. source, a pair of switching semiconductor devices, and a transformer are in common use. The circuit exists in either the free running or the driven form. In the free running form, feedback windings provide positive feedback necessary for oscillation and sometimes negative feedback for control purposes. Once started, the inverter, will oscillate with alternate conduction of the power transistors and the reversals in current in the primary windings will produce an alternating voltage in the output winding. In the feedback circuit, the base drive is normally limited by a serially connected resistor. The converter will switch from one direction of conduction to the other when the collector current demand on the output circuit due to magnetizing current plus reflected load current exceeds the collector current that can be sustained by the resistance limited base drive current. For a fixed load, the switching occurs when the core saturates, the primary impedance falls, and the magnetizing current starts to rise. The amount of core saturation will change under variable load conditions since the ratio of magnetizing current to reflected load current changes. When power transistors are used in high power application, the transistors must have high sustained collector to emitter voltage ratings as well as a high current handling capacity. The high voltage transistors must be fabricated with high purity semiconductor material to obtain a high voltage rating and this results in transistors that exhibit long storage times. Shorter times can be achieved by doping the active region but this reduces the voltage rating. At the moment of commutation, the storage time delays the actual transistor turn off from that commanded by the base drive. The result is that very large instantaneous current spikes can be generated that will result in transistor failure if the core is heavily saturated. When external drive is used to prevent magnetic saturation other problems arise. The storage time will result in conduction overlap if complementary drive signals are applied to the two switches. At start up, the tolerable drive period is reduced from that of the running state because the linear core material starts from a remnant state that is less than the ± peak flux density achieved in the running state. Thus, the drive period for the first half cycle must be reduced from the running state drive period.

An approach related to that of the present invention is that of U.S. Pat. No. 3,914,680 by Joseph P. Hesler and Samuel M. Korzekwa, entitled "Static Inverter". In that application, a single aperture was introduced into a magnetic core to divide the core into two branches and regenerative and degenerative windings were introduced coupled to one or the other branch and both switching devices were controlled from the same aperture. The inverters there depicted, while having essentially equal peak loads to those herein disclosed, were quite subject to negative collector currents, limiting their ability to operate at minimum loads. The circuits also were unoptimized in respect to power dissipation in the control circuitry and/or in the number of components.

SUMMARY OF THE INVENTION

Accordingly, it is an object of the present invention to provide an improved static inverter.

It is another object of the invention to provide an improved static inverter capable of free running operation.

It is still another object of the invention to provide an improved inverter having a lowered minimum load, permitting operation over an increased load range.

It is an additional object of the invention to provide an improved static inverter in which the stress on the switching device is reduced and in which a minimum of parts is required.

It is a further object of the invention to provide an improved static inverter in which the stress on the switching device is reduced and in which power dissipation in the control circuit is minimal.

It is an additional object of the invention to provide an improved static inverter using power transistors as the switching devices.

It is another object of the invention to provide an improved static inverter using power transistors as the switching devices that is capable of free running operation over a wide load range.

These and other objects of the invention are achieved in a novel static inverter comprising a pair of semiconductor power switching devices, and a power transformer having a core with which primary, secondary, and control windings are associated. The core is of a substantially linear magnetic material having a closed magnetic path of approximately uniform cross-section with a pair of apertures in the core, each aperture partitioning the magnetic cross section in a localized region into two branches between which the flux may be steered with a magnetomotive force. A pair of primary power windings and a secondary power winding are provided encircling the full core cross-section. Each primary is coupled between an ouput electrode of one of the semiconductor devices and a source of d.c. bias potentials for generating an alternating flux as the devices are switched to produce an alternating voltage output in the secondary winding. Means are provided for causing the power switching devices to conduct in alternation, including two pairs of feedback windings. The first pair are regenerative feedback windings, with one winding $R_1$ passing through the first aperture, the other winding $R_2$ passing through the second aperture, and each winding $R_1$ and $R_2$ being associated with a first branch at the respective aperture. The second pair are degenerative feedback windings, with one winding $D_1$ passing through the first aperture, the other winding $D_2$ passing through the second aperture, and each winding $D_1$ and $D_2$ being associated with a second branch at the respective aperture. The first regenerative $R_1$ and the first degenerative $D_1$ winding are connected in series opposition between the input electrodes of the first semiconductor device and the second regenerative $R_2$ and the second degenerative $D_2$ windings are connected in series opposition between the input electrodes of the second semiconductor device.

In addition, means are provided to cause a higher differential magnetization rate in each first branch than in the adjacent second branch to cause the first branch to saturate first. Saturation removes the regenerative feedback and applies degenerative feedback, now unopposed by regenerative feedback, to the input electrodes which causes a reverse input bias in advance of full core saturation and avoids stressing the switching devices. Preferably the power switching devices are power transistors having base, emitter and collector electrodes.

In one embodiment of the invention, the differential magnetization between the first and second branches is achieved by a pair of windings, each encircling a first branch of each aperture and connected to the collector of each power transistor. These windings create a flux in the same sense as the primary power windings and cause the first or regenerative branch to saturate first.

The differential magnetization rate may also be achieved by coupling the windings in the emitter path of the power transistors. A third method is to provide a resistive load shunting the degenerative windings.

A fourth method is to provide a load in the form of a pair of auxiliary transistors. The emitter and the collector of each auxiliary transistor are coupled to the respective end terminals of each degenerative feedback winding. The input junctions are each connected in series with a resistance across a regenerative feedback winding. In this latter configuration each of the auxiliary transistors is conductive to current generated by the associated degenerative feedback winding during the regenerative feedback interval and remain nonconductive to current generated by the associated degenerative feedback winding during the remainder of the half cycle that the associated power transistor conducts. Each auxiliary transistor remains non-conductive during the half cycle that the non-associated transistor conducts. For greater freedom in choosing current and voltage requirements in the auxiliary transistor, a separate set of regenerative and degenerative windings may be provided to each side of the inverter. This permits one to add more turns in the degenerative windings — and allows one to use a lower current auxiliary transistor.

BRIEF DESCRIPTION OF THE DRAWINGS:

The novel and distinctive features of the invention are set forth in the claims appended to the present application. The invention itself, however, together with further objects and advantages thereof may best be understood by reference to the following description and accompanying drawings in which

FIG. 1A, 1B and 1C supplement the FIG. 1 embodiment but also pertain to the other embodiments.

DESCRIPTION OF A PREFERRED EMBODIMENT

Figure 1:
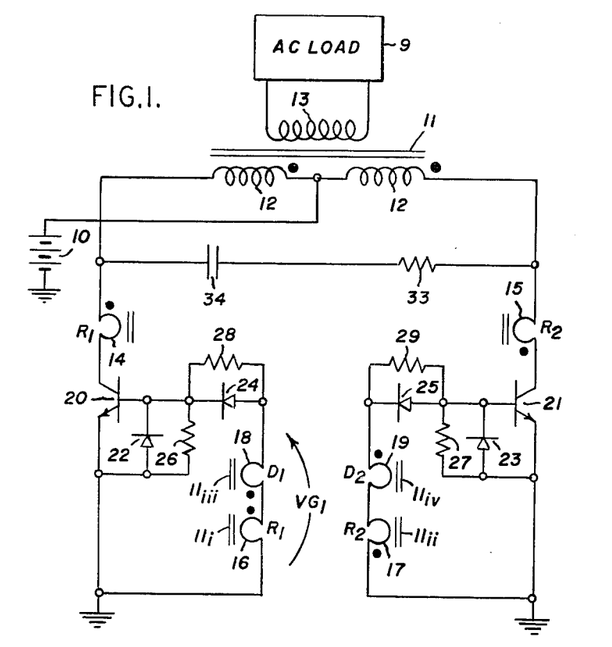
FIG. 1 is a simplified electrical circuit diagram of a novel static inverter utilizing double apertures to partition the core into branches and having six control windings, three associated with each switching transistor. A primary control winding is connected in each collector path to provide the proper differential branch magnetization, while a regenerative and a degenerative secondary control winding are connected in each base circuit.

The static inverter illustrated in FIG. 1 utilizes a push-pull transistor circuit as a "chopper" for performing the inversion from d.c. to a.c. While the transistor switching may be provided by an external drive, the FIG. 1 embodiment is "free running". Inversion from d.c. to a.c. permits an output voltage to be transformed to a higher or lower value as required for the intended application and permits the introduction of controls (by means not shown) for readily starting and stopping the oscillation. The a.c. output may be used in a.c. form, or rectified to convert it back to d.c. In performing the inversion from d.c. to a.c., a major interest of the present invention is to do so with an economy of design.

The static inverter of FIG. 1 comprises a power transformer having a double apertured core upon which a center tapped primary power winding 12 and a secondary power winding 13 are wound; a snubber circuit shunting the primary power winding 12 and including a series connected resistance 33 and a capacitance 34; a pair of power switching transistors 20 and 21; a control circuit comprising six control winds 14 – 19 threading the apertures and encircling separate branches of the core formed by the apertures; four diodes 22–25 and four resistances 26–29. The inverter may be regarded as divisible into a power circuit and a control circuit. The power circuit will be discussed first.

The power circuit furnishes power from the d.c. source to the a.c. load 9. It includes the primary 12 and secondary 13 power windings wound on the main core 11 of the power transformer, the snubber circuit 33, 34 and the power switching transistors 20, 21. The transistors 20, 21 each have base, emitter and collector electrodes. Both emitters are grounded. One collector of transistor 20 is connected through a first control winding 14 to an undotted end terminal or the primary power winding 12. The collector of transistor 21 is connected through a second control winding 15 to the dotted end terminal of primary power winding 12. A center tap of the primary power winding 12 is connected to the positive terminal of the d.c. source 10. The negative terminal of source 10 is grounded. Assuming that transistors 20 and 21 are controlled to be alternately conducting, a path for current is completed from the positive source 10 into the center tap, through alternate halves of the primary winding and through the transistor which is then conducting to ground. This alternating current flow causes an alternating flux in the core 11. The resistor 33 and capacitor 34 serially connected across the primary power winding 12 form a snubber circuit which reduces the collector voltage rate of rise and peak value after turn off to protect the power transistors. In response to the alternating flux in the core 11, an alternating output voltage is developed in the secondary power winding (13). The alternating output voltage is coupled to the a.c. load 9.

Figure 2:
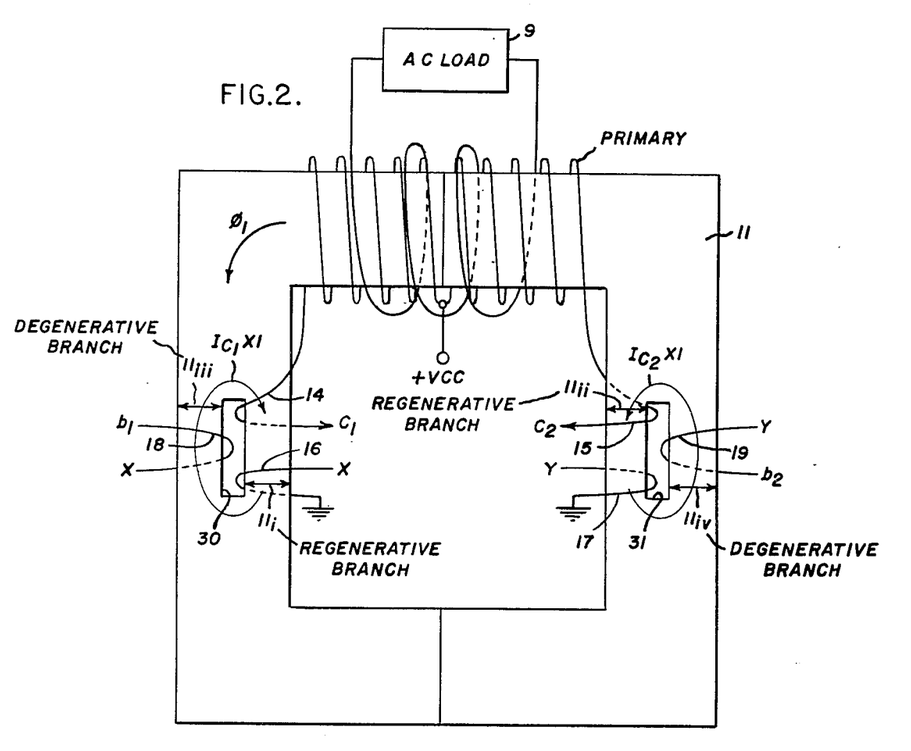
FIG. 2 is a mechanical drawing of the FIG. 1 embodiment illustrating particularly the core, the two apertures which partition the core in two places, and the location and sense of the power and control windings associated with the core. For clarity, the apertures are illustrated larger than required.

The double apertured core and windings of the power transformer are best seen in FIG. 2. The core is of a substantially linear magnetic material having a closed magnetic path. The core is ideally a continuous toroid, but in practice may be formed of either a fired "soft" ferrite material sectioned and reassembled to have a minimum air gap at the joint, or formed with soft iron stampings or tape assembled in a loop. For control purposes, two small apertures 30, 31 are introduced into the core, each aperture partitioning the core into two localized divisions or branches $11^i$, $11^{ii}$, $11^{iii}11^{iv}$. The primary and secondary power windings 12 encircle the full core cross section (11) and are normally remote from the two apertures with which the six control windings are associated.

The control circuit is coupled to the base circuits of the switching transistors. It is responsible for controlled alternate conduction of the transistors 20 and 21 necessary to a free running oscillatory condition. The control circuit acts in response to the flux in the core and its branches. Assuming the emitters to be grounded, the control circuit applies a control signal to the bases of switching transistors 20 and 21 referenced to ground. In applying the control signal, the control circuit provides regeneration and degeneration and commutates the oscillatory circuit.

Regeneration is provided by four 14–17 of the six control windings operating in a control circuit which includes the other two 18, 19 control windings, diodes 24 and 25 and resistances 28, 29. The six control windings are single turn windings of which three 14, 16, 18 associated with transistor 20 pass through aperture 30 and three 15, 17, 19 associated with transistor 21 pass through aperture 31. Passage through an aperture permits the control windings to encircle only one branch of the core. The four windings 14–17 essential to regenerative operation encircle only the inner $11^i$ or $11^{ii}$ "regenerative" branch of the core. As will be seen, the three windings associated with each aperture form a separate virtual current transformer of which one winding is primary and two windings are secondaries. The dot notation on the drawing is with reference to the primary winding and the main core flux including those portions of the flux that goes through the branches.

The control windings are connected to the switching transistors in the following manner. The collector of transistor 20 is coupled to the undotted end of the first primary control winding 14, with the dotted end being coupled to the undotted end of primary power winding 12. Thus, the two windings 12, 14 are wound in the same sense. Similarly, the collector of transistor 21 is coupled to the dotted end of the second primary control winding 15, with the dotted end being coupled to the dotted end of the other half of primary power winding 12 so that these two windings are also in the same sense. The secondary control winding 16 is connected in the base circuit of transistor 20. It has its undotted end coupled to ground, and its dotted end leading through a second secondary control winding 18 to the anode of diode 24, of which the cathode is coupled to the base of transistor 20. A resistor 28 shunts the diode 24. Similarly, the secondary control winding 17 is connected in the base circuit of transistor 21. It has its dotted end coupled to ground, and its other end leading (through a second secondary control winding 19) to the anode of diode 25, of which the cathode is coupled to the base of transistor 21. A resistor 29 shunts the diode 25.

A diode 22 shunted by a resistance 26, is connected across the input junction of transistor 20, and poled opposite to the input junction to protect it from reverse voltage breakdown. A similar diode 23, shunted by a resistor 27, is connected across the input junction of transistor 21, and poled opposite the input junction for the same purpose.

The control windings 14–17 apply a regenerative feedback signal to the bases of the switching transistors which helps to sustain oscillations and, as will be explained, is properly timed to avoid full core saturation that might overstress the transistors. As best seen in FIG. 2, the primary control winding 14 associated with the collector of transistor 20 is threaded through the same aperture 30 as the secondary control winding 16 associated with the base of transistor 20. The two form a first current transformer, of which the core is the magnetic material surrounding the aperture 30 and consisting of branches $11^i$ and $11^{iii}$ in series. The primary of the current transformer is the winding 14 which is energized by current from the collector of transistor 20, and the secondary is the winding 16 which applies a feedback signal to the base of transistor 20. Similarly, the primary control winding 15 associated with the collector of transistor 21 is threaded through the same aperture 31 as the secondary control winding 17 coupled to the base of transistor 21. Together they form a second current transformer with winding 17 providing regenerative feedback. When collector current flows in transistor 20, primary control winding 14 induces a feedback voltage in secondary control winding 16 applying it to the base of transistor 20. The respective windings are phased to provide regeneration, by which is meant that once collector current has begun, they act on the base in a sense to further increase collector current. The self-regenerative action described above takes place alternately in each switching transistor.

The self-regenerative action is dependent on saturation effects and is influenced by the presence of the third pair 18, 19 of secondary control windings whose connections were previously noted.

The desired effect of saturation of a branch of the core is to effectively open the virtual toroid and terminate the regenerative feedback and reduce the collector current in the conducting transistor prior to full core saturation. In fact, saturation of the full core is prevented. If the full core were allowed to saturate, the load impedance magnetizing inductance of the primary power winding of the conducting power transistor would be reduced to the very low impedance that the primary winding would have had, had it been wound on an air core. This reduction in impedance would demand greatly increased amounts of current from the conducting power transistor. The increased current demand would result in overstressing the transistors and shortened transistor life. The lowering of the forward base drive and in fact reversing it prior to full core saturation prevents these stresses.

The apertured magnetic structure produces a partitioned core whose branches saturate in sequence and prior to potential full core saturation. As seen in FIG. 2, the apertures 30, 31 associated with the regenerative feedback current transfomers are placed at an intermediate point between the inner and outer limits of the full core cross-section. Thus, assuming a natural build-up of magnetization in successive, closed, boxlike lamina, the apertures partition the core between shorter and larger laminar paths.

The core does in fact progressively saturate, starting from the inner and shorter flux-paths of the inner branch $11^i$ or $11^{ii}$ and progressing to the outer longer flux paths of the outer branch $11^{iii}$ or $11^{iv}$ to produce the desired early cut-off of regenerative feedback. This order of magnetization is due not only to differences in path lengths but also to the flux steering effect of the current in the primary control windings 14–15. The current in winding 14 creates a localized flux in the core material encircling the aperture 30. Noting that the primary power winding and primary control winding are wound in the same sense about the full core loop, this local flux is in opposition to the main flux from primary power winding 12 in the outer branch $11^{iii}$ and in support of the main flux in the inner branch $11^i$. The magnetomotive force is thus greater (by the amount attributable to the current transformer primary) on the inner branch $11^i$ of the core, and that branch proceeds to saturate first. So long as the inner branch $11^i$ is unsaturated, the winding 14 acts as the primary of a current transformer, magnetically inducing regenerative current in secondary winding 16, and applying it to the base of transistor 20. When the inner branch $11^i$ saturates, the flux may not increase any more around the aperture. At that point, magnetic coupling between the control windings 14 and 16 is terminated. Thus, at the moment of inner branch saturation, the regenerative feedback is cut off and the forward biasing base drive to switching transistor 20 is terminated.

Figure 1A:
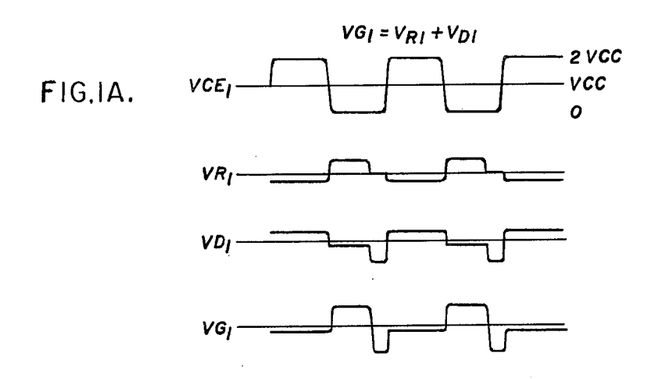
FIG. 1A is an illustration of the waveforms useful in explaining the operation of each of the illustrated embodiments.

FIG. 1A plots the base drive $V_{R1}$ attributable to the regenerative feedback winding 16 applied to transistor 20. The curve shows its termination before the end of the conduction period. The collector voltage $V_{CE}$ is coupled in the primary power winding 12 and is the first waveform in FIG. 1A, and the waveform to which the others are referenced. The collector voltage takes the form of a sequence of substantially rectangular pulses of alternate polarity about the $V_{CC}$ value with the positive portions being attributable to transistor 21 conducting, and the more negative portions being attributable to transistor 20 conducting. These rectangular pulses have a small rise time and a small fall time and once oscillations are under way, the conduction periods are of like duration.

The degenerative windings 18, 19 have an influence, noted earlier, on the regenerative action and supplement the regenerative feedback winding in bringing an end to the conduction cycle. As illustrated in FIG. 1, a degenerative winding 18 or 19 is connected in series with a regenerative winding 16 or 17 in the base circuit of each transistor. The degenerative winding is linked with the outer branch $11^{iii}$ or $11^{iv}$ of the core and is poled oppositely to the regenerative winding in respect to the flux in the main core. Thus, any voltage induced in the degenerative winding as a result of a flux in the main core opposes that of the regenerative winding and may be used to backward bias the switching transistors.

The joint contribution of the two windings 16, 18 goes from a net regenerative to a net degenerative effect as a result of changes in core saturation. When the inner branch $11^i$ or $11^{ii}$ is still unsaturated, the regenerative winding 16 prevails over the degenerative winding 18, and the net effect is regenerative. When the inner branch is saturated, the voltage in the degenerative winding is substantially unopposed by the regenerative winding and the net effect is degenerative. The degenerative waveform for transistor 20 taken by itself is the third waveform $V_D$ in FIG. 1A. The composite voltage of the two windings taken together is the fourth waveform $V_G$.

During the first portion of the conduction cycle of transistor 20 (when the inner branch $11^i$ is unsaturated), the output voltage is small in opposition to $V_R$ which is substantially larger. The reason that the voltage developed in a regenerative winding 18 having an equal number of turns (1 in each case, but wound in an opposite sense) can exceed the voltage developed in the degenerative winding may be explained in the following manner. The control windings 14, 16 and 18 all act on the magnetic material encircling the aperture 30 and produce a given change in magnetization ($\Delta H.l$) about that closed path. The winding 14 generates an encircling flux in that closed path and both windings 16 and 18 wound in a sense to produce output currents of the same polarity.

$$I_c \times 1 = I_b 2 + \phi H dl \qquad (1)$$

where $\phi H dl$ is the closed integral about the aperture of the magnetomotive force per unit length calculated around the aperture (30) $I_c \times 1$ is the input mmf to the current transformer equal to the collector current $I_c$ times the primary turns (1) $I_b \times 2$ is the counter mmf produced by the output of the current transformer equal to the base current ($I_b$) times the series aiding secondary turns (2)

$$\phi H dl \approx \Delta H l \qquad (2)$$

where $\Delta H.l$ is the differential mmf acting about the aperture and $l$ is the effective branch length $$I_b = \frac{I_c - \phi H dl}{2} \qquad (3)$$

This expression indicates that the base current $I_b$ will be forced into a fixed relationship with the collector current $I_c$. If $\Delta H$ and $l$ are small with respect to $I_c \times 1$, the base current will be approximately half the collector current.

The expression for the differential magnetization rate between the regenerative and degenerative windings, may be calculated in the following manner:

$$\dot{\phi}R + \dot{\phi}D = \frac{V_{cc}}{N_p} = \frac{\text{Volts}}{\text{turns}} \qquad (4)$$

where $\dot{\phi}R$ is the rate of change in flux in the regenerative branch $11^i$, $\dot{\phi}D$ is the rate of change in flux in the degenerative branch $11^{iii}$, $V_{cc}$ is the supply voltage, and $N_p$, one-half the primary turns The voltage loop equation in the control circuit is $$\dot{\phi}R \times 1 = \dot{\phi}D \times 1 + (V_{FD} + V_{BE}) \qquad (5)$$

where $V_{FD}$ is a forward drop in the diode 24 or 25, and $V_{BE}$ is a junction drop in transistor 20 or 21 Due to the continuity of flux in the main core:

$$\dot{\phi}R + \dot{\phi}D = \dot{\phi}_T \simeq \frac{V_{cc}}{N_p} = \frac{V}{t} \qquad (6)$$

where $_tV$ is the operating volts per turn of the main core. Substituting for $\dot{\phi}R$ $$V/t - \dot{\phi}D = \dot{\phi}D + V_{FD} V_{Be} \qquad (7)$$

Thus, the collector current may be regarded as flowing in a one turn primary winding and the base current as flowing in a secondary winding of two turns. The relationship leads to the following expression.

Solving for $\dot{\phi}D$:

$$\dot{\phi}D = \frac{\frac{V}{t} - V_{FD} - V_{BE}}{2} \qquad (8)$$

Similarly, $$\dot{\phi}R = \frac{\frac{V}{t} + V_{FD_1} + V_{BE_1}}{2} \qquad (9)$$

The regenerative feedback voltage until the inner branch saturates thus exceeds the degenerative feedback by $$\Delta \dot{\phi}F = (V_{FD} = V_{BE}) \qquad (10)$$

Should this difference not produce a fast enough differential magnetization rate to turn off the transistor in time, the degenerative winding may be given two turns rather than one. This leads to magnetization rates of $$\dot{\phi}R = \frac{2}{3}\frac{V}{t} + \frac{\text{(diode drops)}}{3} \qquad (11)$$

$$\dot{\phi}D = \frac{1}{3}\frac{V}{t} - \frac{\text{(diode drops)}}{3}$$

The equations developed above making the regenerative feedback predominant and favoring stronger conduction are true so long as the inner branch $11^i$ or $11^{ii}$ of the core is unsaturated. When the inner branch saturates toward the end of each half cycle of conduction, two effects occur to turn off the conducting transistor. As previously noted, and as illustrated in the second curve of FIG. 1A, the regenerative feedback in 16 or 17 falls at this moment to near zero. Thus, the degenerative feedback in the winding 18 or 19 is no longer opposed. In addition, the main flux still powered by the conducting transistor, flows into the outer branch $11^{iii}$ of $11^{iv}$ to which degenerative winding is coupled, and causes a sharp increase in degenerative feedback. This is as illustrated in the $V_D$ graph in FIG. 1A. Thus, the input junction is switched from a forward to a reverse bias condition. While conduction does continue in the conducting transistor after base drive is reversed, conduction is a consequence of "stored" charges which are swept out over a short time interval. The circuit may be adjusted by adding turns to the regenerative winding or adding a load common to both to insure that conduction in the first transistor is near zero before the other transistor is switched on.

The commutation from the one switching transistor 20 to the other switching transistor 21 takes place in the following manner.

Well into the half cycle of conduction by transistor 20 which causes a counterclockwise flux about the main core, regenerative branch $11^i$ at aperture 30 saturates, causing the remaining flux to swing over to the degenerative branch $11^{ii}$ at aperture 30. This causes a reverse bias on transistor 20 as noted earlier. After dissipation of stored charge, transistor 20 ceases conduction, and since transistor 21 is still shut off, the mmf (magnetomotive force) on the main core is removed. At that moment, the core has a general level of magnetization or flux density $M_1$; a higher, saturated magnetization in the regenerative branch $11^i$ associated with perforation 30; and a lower, unsaturated magnetization in the degenerative branch $11^{iii}$ associated with aperture 30. (The flux density in the main core is intermediate to that in the branches $11^i$ and $11^{iii}$.)

On the remote side of the core, and in the vicinity of aperture 31, the magnetomotive force of transistor 20 has also established a higher magnetization level in the inner regenerative branch $11^{ii}$ than in the outer degenerative branch $11^{iv}$, for reasons that will be explained below.

At the moment of no external magnetomotive force, the stored energy in the magnetic material of the core is released as the core tries to settle everywhere to its remanent magnetic state. The main core release of energy results in a transient flux in the clockwise direction about the main core. The differential magnetization levels about both apertures 30, 31 result in a transient flux movement in the short paths about the apertures.

At aperture 30, the transient flux moves counterclockwise and reduces reverse biasing voltages in the base of transistor 20 so as to further turn it off. At aperture 31, the transient flux moves counterclockwise also, but this flux results in forward biasing voltages being induced in both base windings of transistor 21. The forward bias produced by flux equalization about aperture 31 results in the initiation of collector current in transistor 21. This collector current then steers the main core transient flux through the regenerative branch $11^{ii}$ and further increases the conduction of transistor 21.

The final magnetization levels in $11^i$, $11^{iii}$, $11^{ii}$, $11^{iv}$, at the end of each conduction period are determined by the past history of the localized flux switching in these branches. Since the voltage time areas developed by regenerative windings 16 and 17 over their respective regenerative halfcycles must exceed the volt time areas of the corresponding degenerative windings 18 and 19 in order to have regenerative base current flow in opposition to the base loop voltage drops, the total flux swing in the regenerative branches over any half cycle must exceed the total flux swings in the degenerative paths. This results in the regenerative branches having larger flux saturation levels than the degenerative branches at the ends of each half cycle.

The "off" transistor remains off during the conduction of the other transistor as implied in the FIG. 1 waveforms. Since there is no collector current about the local aperture, the flux steering from that source is gone. Any flux in the regenerative branch about the local aperture must exceed that in the degenerative branch, when the remote transistor is conducting for the reason stated above. Since the main core flux is reversed, the excess does effect some flux steering in a direction to increase the reverse bias on the near transistor. However, if the voltage in near degenerative winding 18 tries to become greater than that in the near regenerative winding 16, a current will flow through the base bias resistors in a sense to cause the voltage in winding 18 to decrease and that in winding 16 to increase. The net effect is to reduce any net voltage from the series connected windings, and the "near" transistor remains off.

Figure 1B:
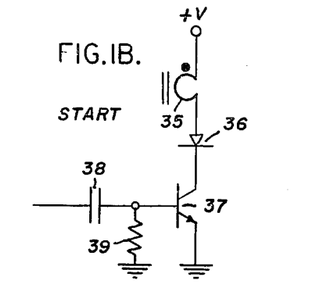
FIGS. 1B and 1C illustrate start and stop circuits which may be used with each of the illustrated embodiments.
Figure 1C:
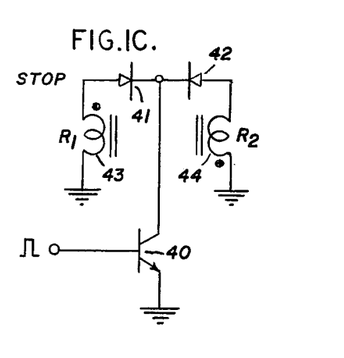

The first embodiment requires a separate start and stop control circuit as shown in FIGS. 1B and 1C. The starting circuit includes a single turn "start" winding 35, a protecive diode 36 and a transistor 37 connected in series between B$_T$ and ground. An input network is provided including a capacitor 38 for coupling a positive going start pulse to the base of transistor 37, and a resistance connected between base and ground. When the positive going pulse is applied to the base of transistor 37, it conducts causing a momentary flow of current through the winding 35. The winding 35 is threaded through one aperture 30 of the core in the same sense as the collector winding 14. The current flow sets up a steering flux, providing a forward drive to the switching transistor 20, and turns on that transistor to commence oscillation. It is normally preferable that the start winding be separate so as to permit d.c. isolation between the two circuits.

The stop circuit consists of a transistor 40, a pair of diodes 41, 42 and a pair of stop windings 43, 44. The stop windings 43, 44 are wound about each regenerative branch 11$^i$ and 11$^{ii}$ of the core and each normally consists of two turns. D.C. isolation normally dictates that they be separate from the other windings. A positive voltage is used to inhibit oscillation. The voltage turns on transistor 40, and creates a low impedance on the windings 41 and 42 on each regenerative leg of the core during their respective regenerative feedback periods. The low impedance load prevents the flux from increasing in the regenerative legs and thus forces the flux to increase in the degenerative legs thereby causing the conducting transistor 20 or 21 to have a degenerative signal applied to its base. Both the start and stop circuits function with the d.c. bias control winding applied. One may, of course, not use a stop circuit and merely turn off the d.c. source. One may also build the start circuit that is turned on when the d.c. source is turned on.

Using the indicated power transistor, diodes, component values and a power transformer having a ferrite core of 1 inch × 1 inch cross-section, a practical version of the first embodiment switching at a rate of 10 kilocycles is capable of delivering a power output of 2.5 kilowatts. The supply is designed to be energized from a d.c. source of from 250 to 400 volts and the secondary output voltage can vary from a low value of a few volts to tens of kilovolts.

The transformer core is a ferrite formed of two c cores of 3C5 (Ferroxcube) ferrite. The apertures are placed midway between the inner and outer surfaces and midway along the leg of each c core. The inner opening of the rectangular toroid formed by assembling a pair of like c cores is 2 inches × 2.5 inches and the outer dimensions are 4 inches × 4.5 inches. The core cross section is 1 inch × 1 inch.

Figure 3:
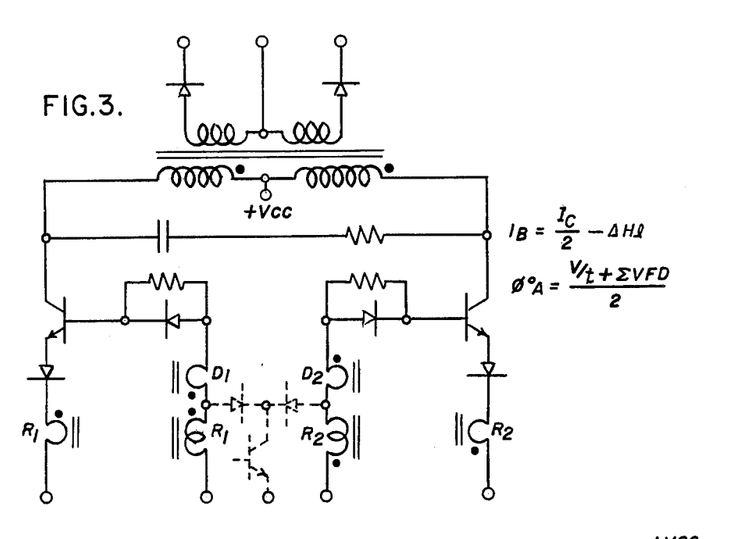
FIG. 3 is a simplified circuit diagram of a second embodiment of the invention wherein the proper differential branch magnetization is achieved by the use of a primary control winding connected in the emitter path of each switching transistor.
Figure 4:
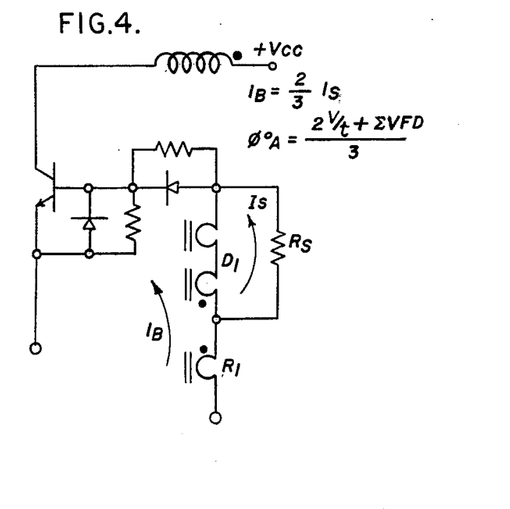
FIG. 4 is a simplified circuit diagram of one half of a third embodiment wherein the proper differential branch magnetization is provided by resistively loading the control circuit coupled to the base of the switching transistor. It avoids the need for separate primary control windings.

The power transformer windings are selected to provide approximately seven volts per turn, 50 turns for each primary power winding and one turn each are used for all six of the control windings. The user may select the secondary output voltage by setting the number of secondary turns. As illustrated in FIGS. 3 or 4, one may increase the degenerative winding to two turns. Adequate feedback without excessive dissipation is usually provided by one or two turns.

The transistors are high production, low cost power transistors such as are used in television applications and such as are likely to have appreciable stored storage time. If 5 kilowatts of power are required, two power switching transistors may be paralleled on each side of the inverter. Normally no more than two transistors may be paralleled. Higher power requirements may be achieved by using higher power transistors, and eventually larger cores.

As illustrated in all of the configurations, a first pair of diodes 24, 25 are provided, each shunted by a resistor 28, 29 and each connected in series with a serial pair of regenerative and degenerative windings to the base of each power transistor. The values of resistors 28, 29 set the maximum magnitude for the reverse bias and are each 3 ohms. The reversely poled protective diodes 22, 23 connected between the base and emitter of each of the power transistors are shunted by a pair of resistors 26, 27 each of 10 ohms. Their value is selected to insure the timely discharge of the collector base capacity by the end of each conduction cycle.

In the first embodiment, the necessary differential magnetization rates between the regenerative degenerative windings is achieved by the introduction of a winding in the collector of each of the switching transistors 20, 21. The same effect may be achieved by the use of a winding coupled in the emitter circuits of each of the switching transistors. This arrangement, which forms the second embodiment, is shown in FIG. 3. The senses of the emitter windings are the same as the collector windings in the first embodiment, but an additional turn in each regenerative winding is normally required to provide the requisite differential magnetization. The base current tends to be equal to one half the collector current.

$$I_B = I_c/2 - \Delta\, Hl \tag{12}$$

The magnetization rates are $$\dot{\phi}_R = \frac{V/T + \text{(diode drops)}}{2} \tag{13}$$

$$\dot{\phi}_D = \frac{V/T - \text{(diode drops)}}{2}$$

A third embodiment of the invention is illustrated in FIG. 4 which is simplified to show one half of the circuit. The flux steering effect is achieved by use of a load applied to the degenerative winding. In the FIG. 4 embodiment, the loading takes the form of a resistive shunt on the degenerative winding and the degenerative winding is preferably increased to two turns.

The input currents are as follows:

$$I_b = 2/3\, I_s \quad (14)$$

Where
$I_b$ is the base current, and
$I_s$ is the shunt current.
The differential magnetization is:

$$\dot{\phi}_R = \frac{2\,V/T + (\text{diode drops})}{3} \quad (15)$$

$$\dot{\phi}_D = \frac{2\,V/T - (\text{diode drops})}{3}$$

Figure 5:
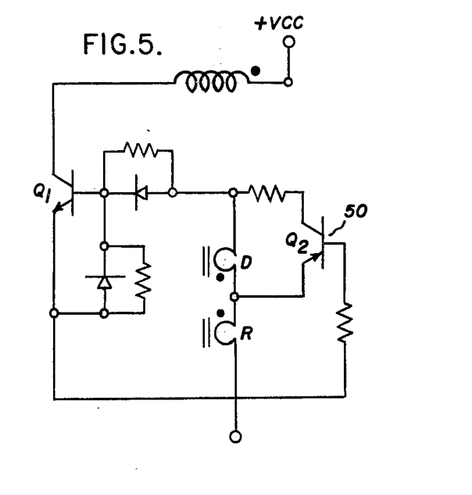
FIG. 5 is a simplified circuit diagram of one half of a third embodiment wherein the proper differential branch magnetization is provided by loading the control circuit coupled to the base of the switching transistor by a second transistor. It avoids the need for separate primary control windings and reduces the amount of power dissipated compared to FIG. 4.

In the FIG. 5 embodiment only one half of the circuit is shown. Here a shunt is provided by an auxiliary transistor 50, having the collector and emitter connected to the ends of the degenerative winding. The input junction is connected in series with a resistance across the regenerative winding. During the interval that the regenerative winding is developing a voltage (i.e., the regenerative branch is not saturated), the auxiliary transistor 50 is turned on to shunt or "crowbar" the degenerative branch and cause flux to be steered through the regenerative branch. During the remaining portion of the conduction cycle, during which interval the regenerative branch is saturated, the shunt is removed. This avoids high power dissipation in the shunt when the degenerative winding is developing full volts/turns. The shunt is off throughout the half cycle that the other transistor conducts. Base circuit ampere turns off the switching transistor are essentially equal to the shunt circuit ampere turns prior to saturation of the regenerative branch.

The FIG. 5 embodiment may also be modified by adding a second pair of regenerative-degenerative windings on each side of the inverter. One set remaining in circuit with the power transistor and the additional set is connected in a separate circuit with the auxiliary transistor. This modification permits one to add additional turns to the degenerative winding thereby decreasing the current requirement of the auxiliary transistor, and permitting use of a lower cost device without increasing the ampere turns in the power transistor base circuit.

Embodiments one and two provide inherent load range extension by means of current feedback. That is, the base drive is proportional to load current demand as reflected in the primary collector or emitter current. For applications where complete load range from zero load to maximum load is desired, embodiments three and four provide a means of operation down to zero load. In the latter case, since the regenerative base current is set by the shunt resistance current, it may be desirable to program the shunt resistance by external means to achieve optimum base drive for wide load range applications.

The self-oscillating circuit has the advantage of a reduced parts count and cost and is simpler than the class of converters which require external drive.

The start and stop circuits shown in FIGS. 1B and 1C and applicable to all embodiments are normally only magnetically coupled. This permits their d.c. isolation from the power circuit. The flux steering mechanism directs flux from the regenerative branch to the degenerative branch when a stop signal is applied regardless of the time into a half cycle. This immediately results in a reverse bias base current (degenerative feedback) and halts the oscillation within the storage time of the main switching device. The elimination of main core saturation and the relatively low power requirement for terminating the oscillation permits "modulation" or repeated starting and stopping of the oscillations for duty cycle control.

What is claimed as new and desired to be secured by Letters Patent of the United States is:

1. A static inverter comprising:
    a. input terminals for connection to a source of d.c. potentials,
    b. a pair of semiconductor power switching devices, each semiconductor device having a pair of input electrodes and an output electrode,
    c. a transformer having
        1. a core of substantially linear magnetic material having a closed magnetic path of approximately uniform cross-section with a pair of apertures in the core, each aperture partitioning the magnetic cross-sections in a localized region into two branches between which the flux may be steered with a magnetomotive force,
        2. a pair of primary power windings encircling the full core cross-section, each coupled between an output electrode of one of said semiconductor devices and said source terminals for generating an alternating flux in said core as said devices are switched,
        3. a secondary power winding encircling the full core cross-section to derive an alternating voltage output,
    d. means for causing said power switching devices to conduct in alternation comprising:
        1. a first pair of regenerative feedback windings, one winding ($R_1$) passing through the first aperture, the other winding ($R_2$) passing through the second aperture, and each winding ($R_1$ and $R_2$) encircling a first branch,
        2. a second pair of degenerative feedback windings, one winding ($D_1$) passing through the first aperture, and the other winding ($D_2$) passing through the second aperture and each winding ($D_1$ and $D_2$) encircling a second branch,
            the first regenerative ($R_1$) and the first degenerative ($D_1$) winding connected in series opposition between the input electrodes of the first semiconductor device and the second regenerative winding ($R_2$) and the second degenerative winding ($D_2$) being connected in series opposition between the input electrodes of the second semiconductor device, and
        3. means to cause a differential magnetization rate higher in each first branch than in the local second branch to cause said first branch to saturate first, said saturation removing the regenerative feedback and applying unopposed degenerative feedback to said input electrodes to cause a reverse input bias in advance of full core saturation thus avoiding stresses on said switching device.

2. The combination set forth in claim 1 wherein said power switching devices are each power transistors having base, emitter and collector electrodes.

3. The combination set forth in claim 2 wherein:
    said differential magnetization means comprises a pair of windings, the first winding encircling a firs branch of said first aperture connected to the collector of said first power transistor to create a flux in the same sense as the primary power winding associated with said collector, and the second encircling a first branch of said second aperture, connected to the collector of said second power transistor to create a flux in the same sense as the primary power winding associated with said last recited collector.

4. The combination set forth in claim 2 wherein:

said differential magnetization means comprise a pair of windings, the first winding encircling a first branch of said first aperture, connected to the emitter of said first power transistor to create a flux in the same sense as the primary power winding associated with the collector of said first power transistor, and the second winding encircling a first branch of said second aperture, connected to the emitter of said second power transistor to create a flux in the same sense as the primary winding associated with the collector of said second power transistor.

5. The combination set forth in claim 2 wherein said differential magnetization means comprise a pair of resistive loads each shunting one of said degenerative windings.

6. The combination set forth in claim 2 wherein said differential magnetization means comprises a pair of auxiliary transistors, said first auxiliary transistor having the emitter and the collector thereof coupled to the respective end terminals of said first degenerative feedback winding and the base emitter junction thereof resistively connected in series across said first regenerative feedback winding, said second auxiliary transistor having the emitter and the oscillator thereof coupled to the respective end terminals of said second degenerative feedback winding and the base-emitter junction thereof resistively connected in series across said second regenerative feedback winding; and each auxiliary transistor being conductive to current generated by the associated degenerative feedback winding during the regenerative feedback interval in the half cycle that the associated power transistor conducts and remaining non-conductive to current generated by the associated degenerative winding during the remainder of that half cycle and the alternate half cycle that the non-associated power transistor conducts.

7. The combination set forth in claim 2 wherein said differential magnetization means comprises:

a. a pair of auxiliary transistors, b. a third pair of regenerative feedback windings, one winding ($R_3$) passing through said first aperture, the other winding ($R_4$) passing through said second aperture, and each winding ($R_3$ and $R_4$) encircling said first branch, c. a fourth pair of degenerative feedback windings, one winding ($D_3$) passing through said first aperture, and the other winding ($D_4$) passing through said second aperture, and each winding ($D_3$ and $D_4$) encircling said second branch, said first auxiliary transistor having the emitter and collector thereof coupled to the respective end terminals of said third degenerative feedback winding and the base emitter junction thereof resistively connected in series across said third regenerative feedback winding, said second auxiliary transistor having the emitter and the collector thereof coupled to the respective end terminals of said fourth degenerative feedback winding and the base-emitter junction thereof resistively in series across said fourth regenerative feedback winding; and each auxiliary transistor being conductive to current generated by the associated degenerative feedback winding during the regenerative feedback interval in the half cycle that the associated power transistor conducts and remaining non-conductive to current generated by the associated degenerative winding during the remainder of that half cycle and the alternate half cycle that the non-associated power transistor conducts.

8. The combination set forth in claim 2 wherein a first pair of diodes are provided, each connected to a base of one of said power transistors in series with a serial regenerative, degenerative winding pair, and poled to conduct during the application of forward bias to said base, and wherein a first pair of resistances are provided, each shunting one of said diodes and having a value selected to control the reverse bias from said degenerative windings.

9. The combination set forth in claim 2 wherein a second pair of diodes are provided, each shunting an input junction of one of said power transistors and connected in reverse polarity with respect to said input junction to prevent reverse junction breakdown, and wherein a second pair of resistances are provided, each shunting one of said second pair of diodes, the values thereof being selected to allow the timely discharge of current stored in the collector-base capacity of said switching transistor at the end of each conduction period.

10. The combination set forth in claim 9 wherein each of said feedback windings are of one or two turns to minimize power dissipation.

* * * * *